(12) United States Patent
Hsu et al.

(10) Patent No.: US 11,193,819 B2
(45) Date of Patent: Dec. 7, 2021

(54) VIBRATION SENSOR WITH MONITORING FUNCTION AND VIBRATION SIGNAL MONITORING METHOD THEREOF

(71) Applicant: INDUSTRIAL TECHNOLOGY RESEARCH INSTITUTE, Hsin-Chu (TW)

(72) Inventors: Yu-Wen Hsu, Tainan (TW); Chao-Ta Huang, Hsinchu (TW); Li-Tao Teng, Tainan (TW)

(73) Assignee: INDUSTRIAL TECHNOLOGY RESEARCH INSTITUTE, Hsin-Chu (TW)

( * ) Notice: Subject to any disclaimer, the term of this patent is extended or adjusted under 35 U.S.C. 154(b) by 270 days.

(21) Appl. No.: 16/516,543

(22) Filed: Jul. 19, 2019

(65) Prior Publication Data

US 2020/0200593 A1 Jun. 25, 2020

(30) Foreign Application Priority Data

Dec. 24, 2018 (TW) .................................. 107146825

(51) Int. Cl.
*G01H 11/06* (2006.01)
*G01N 29/42* (2006.01)
*G01H 1/14* (2006.01)

(52) U.S. Cl.
CPC .............. *G01H 11/06* (2013.01); *G01H 1/14* (2013.01); *G01N 29/42* (2013.01); *B81B 2201/0285* (2013.01); *B81B 2207/012* (2013.01)

(58) Field of Classification Search
CPC ...... B81B 2201/0285; B81B 2207/012; G01H 1/06; G01H 1/14; G01H 11/06;
(Continued)

(56) References Cited

U.S. PATENT DOCUMENTS 4,893,286 A * 1/1990 Cobb ..................... G01S 15/06
367/87
5,195,046 A 3/1993 Gerardi et al.
(Continued)

FOREIGN PATENT DOCUMENTS

CN 101436046 A 5/2009
CN 101801837 A 8/2010
(Continued)

OTHER PUBLICATIONS

Machine Translation of related TWI689708B (Year: 2021).*
(Continued)

*Primary Examiner* — David L Singer
(74) *Attorney, Agent, or Firm* — Locke Lord LLP; Tim Tingkang Xia, Esq.

(57) ABSTRACT

A vibration sensor with monitoring function is provided, which includes a substrate, a microelectromechanical vibration sensor chip and an application-specific integrated circuit chip. The microelectromechanical vibration sensor chip is disposed on the substrate and detects a vibration applied to an object to generate a plurality of vibration signals. The application-specific integrated circuit chip is disposed on the substrate and electrically connected to the microelectromechanical vibration sensor chip, which includes a sampling module, a transform module and an analysis module. The sampling module receives and converts the vibration signals into a plurality of digital signals, and filters the digital signals to generate a plurality of time-domain data. The transform module transforms the time-domain data into a frequency-domain data according to a predetermined number. The analysis module executes a comparison process to compare the frequency-domain data with a predetermined spectrum feature table and generates a notification signal according to the comparison result.

24 Claims, 7 Drawing Sheets

(58) Field of Classification Search
CPC .......... G01H 11/08; G01H 13/00; G01H 3/04; G01N 2291/014; G01N 29/12; G01N 29/38; G01N 29/42; G01N 29/46

See application file for complete search history.

(56) References Cited

U.S. PATENT DOCUMENTS

| | | | |
|---|---|---|---|
| 5,854,994 | A | 12/1998 | Canada et al. |
| 5,982,482 | A * | 11/1999 | Nelson ............... G01N 29/2418 356/237.1 |
| 6,323,730 | B1 | 11/2001 | Hynd |
| 6,412,131 | B1 * | 7/2002 | Zhao ....................... G01H 1/003 73/659 |
| 6,435,902 | B1 | 8/2002 | Groh et al. |
| 6,484,111 | B1 * | 11/2002 | Nara ....................... G01R 23/16 702/106 |
| 6,498,996 | B1 | 12/2002 | Vallot |
| 6,552,404 | B1 | 4/2003 | Hynes et al. |
| 6,889,553 | B2 | 5/2005 | Robinson et al. |
| 6,925,879 | B2 | 8/2005 | Raichle |
| 7,287,428 | B2 | 10/2007 | Green |
| 7,359,816 | B2 | 4/2008 | Kumar et al. |
| 7,720,376 | B2 | 5/2010 | Weinberg et al. |
| 8,179,121 | B2 | 5/2012 | Hynd et al. |
| 8,692,366 | B2 | 4/2014 | Xue et al. |
| 9,024,712 | B2 | 5/2015 | Zusman |
| 9,523,626 | B2 | 12/2016 | Zusman |
| 9,797,452 | B2 | 10/2017 | Den Haak et al. |
| 2001/0007442 | A1 * | 7/2001 | Gerlach ................... H04L 27/30 341/50 |
| 2003/0024332 | A1 | 2/2003 | Traphagen et al. |
| 2005/0021580 | A1 * | 1/2005 | Swanson ............... G01R 23/167 708/405 |
| 2005/0066730 | A1 * | 3/2005 | Raichle .................. G01N 29/42 73/579 |
| 2006/0048578 | A1 * | 3/2006 | Dickinson ............... G01N 29/12 73/602 |
| 2007/0183413 | A1 | 8/2007 | Zusman |
| 2008/0126026 | A1 | 5/2008 | Lee et al. |
| 2010/0054482 | A1 * | 3/2010 | Johnston ................. H04S 1/002 381/17 |
| 2010/0145639 | A1 * | 6/2010 | Fu .......................... G01H 1/003 702/56 |
| 2011/0016980 | A1 | 1/2011 | Plavan et al. |
| 2011/0018075 | A1 * | 1/2011 | Chen ....................... B81B 7/007 257/415 |
| 2011/0041611 | A1 * | 2/2011 | Hofer ...................... G01N 29/14 73/579 |
| 2011/0283768 | A1 | 11/2011 | Peczalski |
| 2012/0041695 | A1 * | 2/2012 | Baldwin ................. G01N 29/11 702/56 |
| 2012/0080764 | A1 | 4/2012 | Xue |
| 2012/0116698 | A1 * | 5/2012 | Lambert ............... H03M 1/1042 702/60 |
| 2014/0150588 | A1 | 6/2014 | Christiansson et al. |
| 2015/0168268 | A1 | 6/2015 | Fish et al. |
| 2015/0338326 | A1 | 11/2015 | Campbell et al. |
| 2016/0154406 | A1 | 6/2016 | Im et al. |
| 2017/0052148 | A1 * | 2/2017 | Estevez .................. G01N 29/11 |
| 2018/0292255 | A1 * | 10/2018 | Miklosovic ............... H02P 6/10 |
| 2018/0337808 | A1 * | 11/2018 | Chen ..................... H04L 27/265 |
| 2020/0186898 | A1 * | 6/2020 | Fischer ................... H04Q 9/00 |

FOREIGN PATENT DOCUMENTS

| | | |
|---|---|---|
| CN | 102167279 A | 8/2011 |
| CN | 202261722 U | 5/2012 |
| CN | 103220610 A | 7/2013 |
| CN | 203551102 U | 4/2014 |
| CN | 103954795 A | 7/2014 |
| CN | 104754456 A | 7/2015 |
| CN | 105637372 A | 6/2016 |
| CN | 106052845 A | 10/2016 |
| CN | 108168811 A | 6/2018 |
| CN | 108249384 A | 7/2018 |
| CN | 108296879 A | 7/2018 |
| CN | 108534889 A | 9/2018 |
| CN | 108666412 A | 10/2018 |
| CN | 108981826 A | 12/2018 |
| JP | 2011101213 A | 5/2011 |
| TW | 200933130 A | 8/2009 |
| TW | I356160 B1 | 1/2012 |
| TW | I422460 B | 1/2014 |
| TW | I633046 B | 8/2018 |
| TW | I689708 B * | 4/2020 ............... G01H 3/04 |
| WO | 2014114518 A1 | 7/2014 |

OTHER PUBLICATIONS

TIPO, "Taiwan Office Action for TW Application No. 107146825", Taiwan, dated Aug. 5, 2019.

G. Betta et al., A DSP-based FFT-analyzer for the fault diagnosis of rotating machine based on vibration analysis, IEEE Transactions on Instrumentation and Measurement, 2002, vol. 51, No. 6.

Ali Rastegari et al., Condition based maintenance of machine tools: Vibration monitoring of spindle units, 2017, Annual Reliability and Maintainability Symposium (RAMS) Conference.

Mary Nyaradzayi Hughslar Chikuruwo et al., Design of an automated vibration monitoring system for condition based maintenance of a lathe machine (Case study), 2016, International Conference on System Reliability and Science (ICSRS).

China Patent Office, "Office Action", dated Jul. 23, 2021, China.

\* cited by examiner

VIBRATION SENSOR WITH MONITORING FUNCTION AND VIBRATION SIGNAL MONITORING METHOD THEREOF

CROSS REFERENCE TO RELATED APPLICATION

The application is based on, and claims priority from, Taiwan Application Serial Number 107146825, filed on Dec. 24, 2018, the disclosure of which is hereby incorporated by reference herein in its entirety.

TECHNICAL FIELD

The disclosure relates to vibration sensor, and relates to a vibration sensor with monitoring function. The disclosure further relates to the vibration signal monitoring method of the vibration sensor.

BACKGROUND

Sensors are important devices for smart machinery industry and smart manufacturing industry. Currently, various sensors have been developed so as to satisfy the requirements of smart machinery industry and smart manufacturing industry. For example, vibration sensors can detect the vibration signals of an object, such as machine tool, motor, ball screw or feeding device, etc. the status data of the object can be obtained by analyzing the aforementioned vibration signals.

SUMMARY

An embodiment of the disclosure provides a vibration sensor, which includes a substrate, a microelectromechanical vibration sensor chip and an application-specific integrated circuit chip. The microelectromechanical vibration sensor chip is disposed on the substrate and detects a vibration applied to an object to generate a plurality of vibration signals. The application-specific integrated circuit chip is disposed on the substrate and electrically connected to the microelectromechanical vibration sensor chip, which includes a sampling module, a transform module and an analysis module. The sampling module includes an analog front-end unit, an analog-to-digital converter unit and a filter unit. The analog front-end unit receives the vibration signals. The analog-to-digital converter unit converts the vibration signals into a plurality of digital signals. The filter unit filters the digital signals to generate a plurality of time-domain data. The transform module includes a transform unit and a time interval unit. The time interval unit transmits a predetermined number to the transform unit. The transform unit transforms the time-domain data into a frequency-domain data and the number of the time-domain data is equal to the predetermined number. The analysis module executes a comparison process to compare the frequency-domain data with a predetermined spectrum feature table and generates a notification signal according to the comparison result of the comparison process.

Another embodiment of the disclosure provides a vibration signal monitoring method, which includes the following steps: detecting a vibration applied to an object to generate a plurality of vibration signals; receiving the vibration signals and converting the vibration signals into a plurality of digital signals; filtering the digital signals to generate a plurality of time-domain data; transforming the time-domain data into a frequency-domain data, where the number of the time-domain data is equal to the predetermined number; and executing a comparison process to compare the frequency-domain data with a predetermined spectrum feature table and generating a notification signal according to the comparison result of the comparison process.

Further scope of applicability of the application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The invention will become more fully understood from the detailed description given herein below and the accompanying drawings which are given by way of illustration only, and thus are not limitative of the invention and wherein.

DETAILED DESCRIPTION

Figure 1:
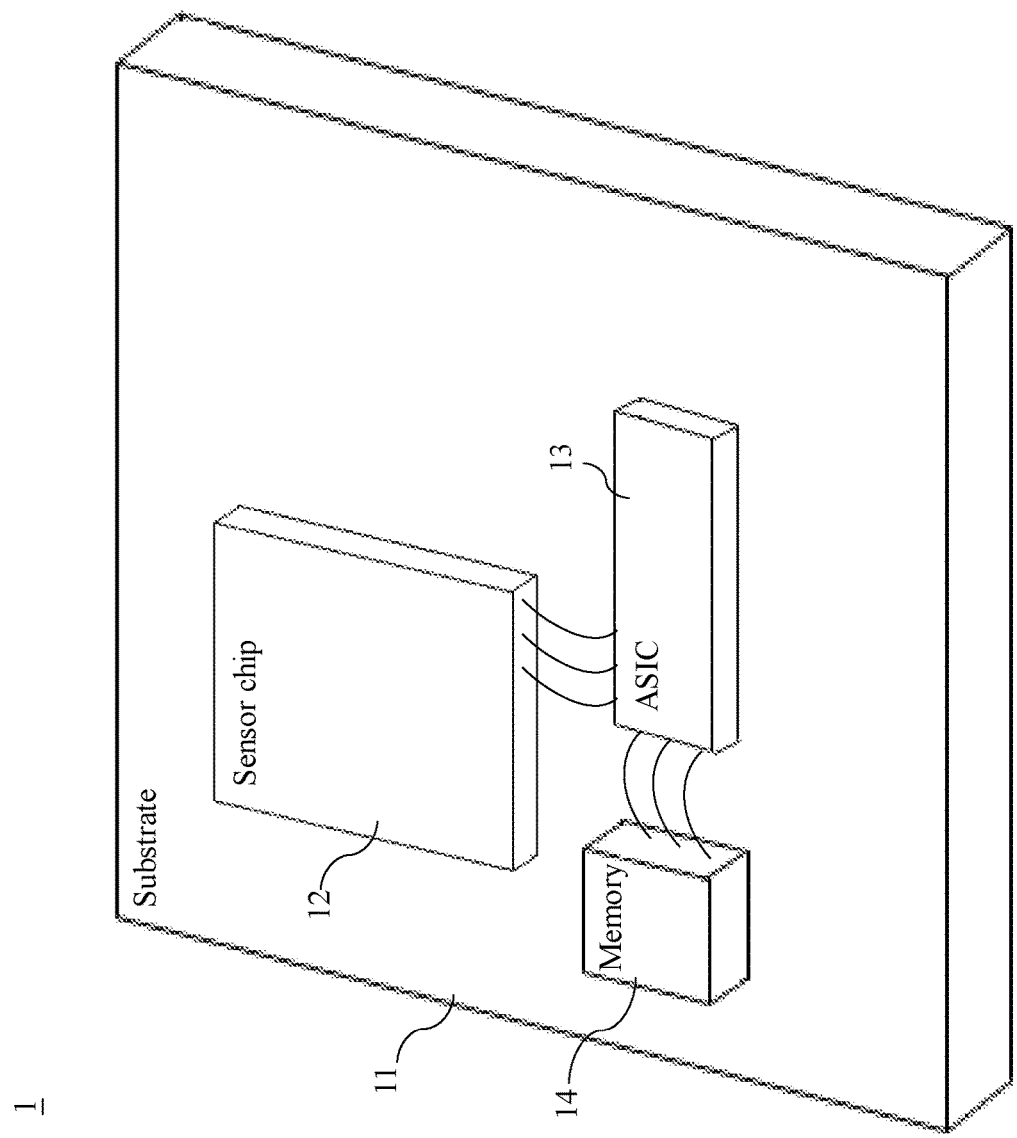
FIG. 1 is a schematic view of a vibration sensor with monitoring function in accordance with a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Please refer to FIG. 1, which is a schematic view of a vibration sensor with monitoring function in accordance with a first embodiment of the disclosure. As shown in FIG. 1, the vibration sensor 1 includes a substrate 11, a microelectromechanical vibration sensor chip 12, an application-specific integrated circuit chip 13 and an optional memory element 14. During the development process of the vibration sensor 1, the memory element 14 is an external device connected to the application-specific integrated circuit chip 13. The memory element 14 can provide different memory spaces according to vibration signals of different objects so as to store the vibration signals and data obtained after analysis. However, when the vibration sensor 1 is in mass production, the memory unit (not shown in FIG. 1) of the application-specific integrated circuit chip 13 can substitute for the memory element 14 so as to reduce the size of the vibration sensor 1 and simplify the assembly process. The microelectromechanical vibration sensor chip 12 is disposed on the substrate 11 for detecting a plurality of vibration signals generated due to a vibration applied to an object. The object may be a device under test (DUT), such as a machine tool, a motor, a ball screw, a feeding device or other devices generating vibration in operation.

The memory element 14 can be selectively disposed on the substrate 11 according to different requirements and can store a predetermined spectrum feature table and various parameters, such as calibration parameters, filter parameters or transform parameters, etc. The memory element 14 may be, for example, a one-time programmable memory, a multiple-time programmable memory, a flash memory or electrically-erasable programmable read-only memory, etc.

The application-specific integrated circuit chip 13 is disposed on the substrate 11 and electrically connected to the microelectromechanical vibration sensor chip 12 and the memory element 14. The application-specific integrated circuit chip 13 receives the vibration signals and converts the vibration signals into a plurality of digital signals. Then, the application-specific integrated circuit chip 13 filters the digital signals to generate a plurality of time-domain signals. Afterwards, the application-specific integrated circuit chip 13 transforms a portion of the time-domain data into a frequency-domain data according to a predetermined number N. The number of the time-domain data transformed into the frequency-domain data is equal to the predetermined number N. Finally, the application-specific integrated circuit chip 13 executes a comparison process and transmits a notification signal according to the comparison result of the comparison process in order to provide the information of the vibration status of the object. The information of the vibration status of the object may, for example, include abnormal vibration warning, frequency spectrum feature diagnosis, healthy status or service life estimation, etc.

As described above, the vibration sensor 1 includes the application-specific integrated circuit chip 13 which integrates frequency spectrum transform function and signal analysis function. Thus, the vibration sensor 1 can perform real-time analysis for the frequency-domain data of the vibration signals, which not only significantly reduces the analysis time, but also enhances the efficiency.

Figure 2:
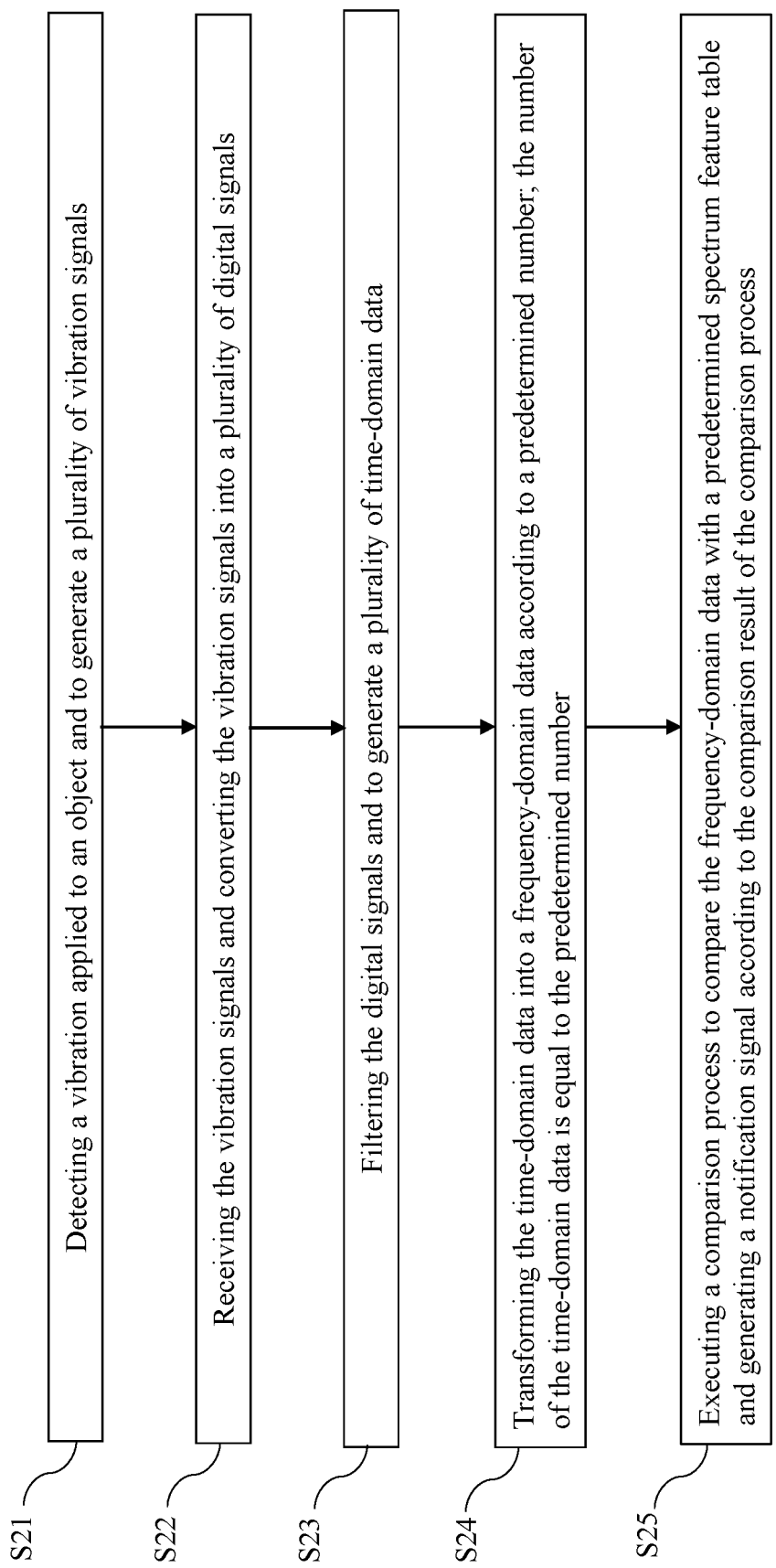
FIG. 2 is a process flow chart of the first embodiment.

Please refer to FIG. 2, which is a process flow chart by which the vibration sensor 1, of the first embodiment, monitors the vibration signals of the object. As shown in FIG. 2, the process flow char of vibration signal monitoring of the vibration sensor 1 of the embodiment includes the following steps:

Step S21: detecting a vibration applied to an object and to generate a plurality of vibration signals.

Step S22: receiving the vibration signals and converting the vibration signals into a plurality of digital signals.

Step S23: filtering the digital signals and to generate a plurality of time-domain data.

Step S24: transforming the time-domain data into a frequency-domain data according to a predetermined number; the number of the time-domain data is equal to the predetermined number.

Step S25: executing a comparison process to compare the frequency-domain data with a predetermined spectrum feature table and generating a notification signal according to the comparison result of the comparison process.

Figure 3:
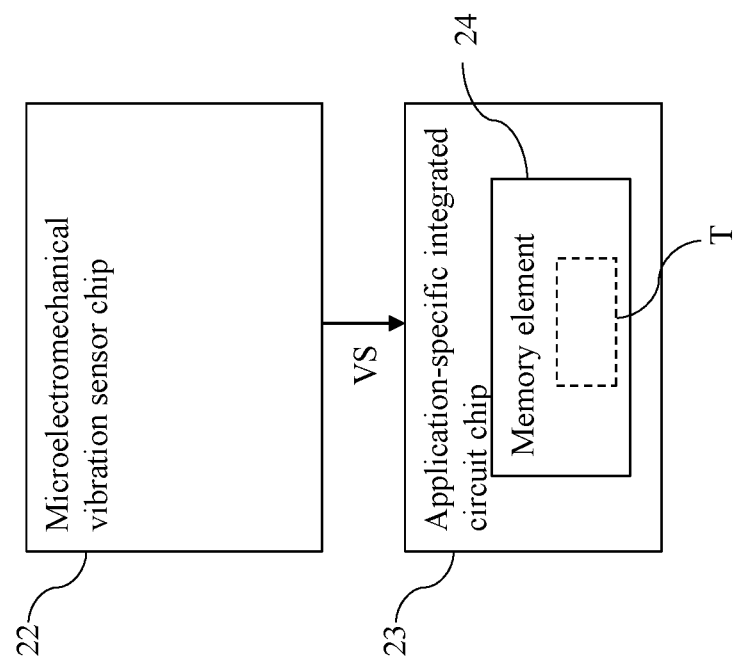
FIG. 3 is a circuit diagram of a vibration sensor with monitoring function in accordance with a second embodiment of the disclosure.
Figure 4:
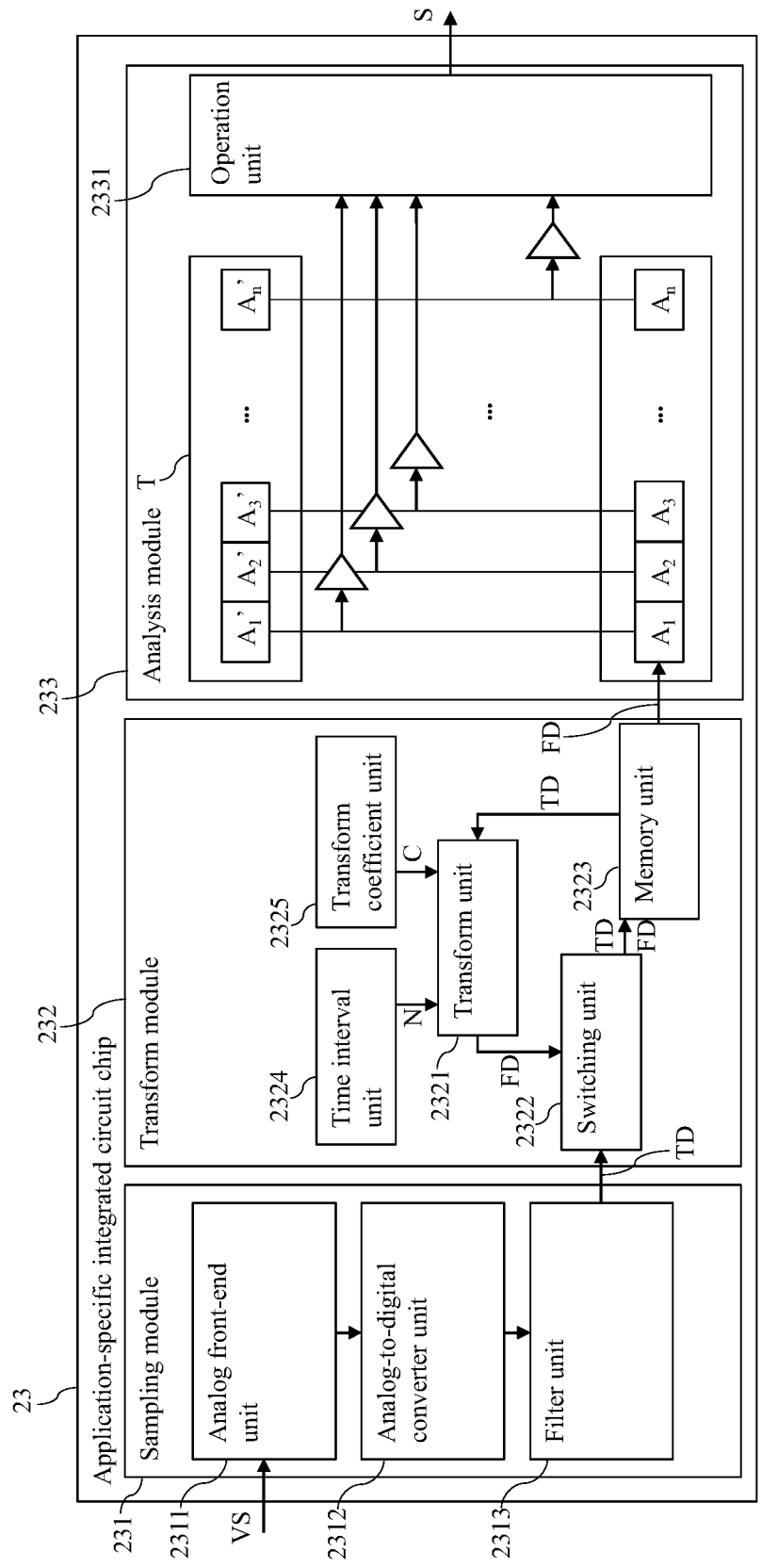
FIG. 4 is a circuit diagram of an application-specific integrated circuit chip of the vibration sensor with monitoring function of the second embodiment.

Please refer to FIG. 3 and FIG. 4, which are a circuit diagram of a vibration sensor with monitoring function and a circuit diagram of an application-specific integrated circuit chip thereof in accordance with a second embodiment of the disclosure. As shown in FIG. 3, the vibration sensor 2 includes a microelectromechanical vibration sensor chip 22, an application-specific integrated circuit chip 23 and a memory element 24 (optional).

The microelectromechanical vibration sensor chip 22 detects a plurality of vibration signals VS generated due to a vibration applied to an object. The object may be, for example, a machine tool, a motor, a ball screw, a feeding device or other devices generating vibration in operation.

The memory element 24 stores a predetermined spectrum feature table T and various parameters, such as calibration parameters, filter parameters or transform parameters, etc. In the embodiment, the memory element 24 is a built-in memory unit of the application-specific integrated circuit chip 23.

The microelectromechanical vibration sensor chip 22 is electrically connected to the application-specific integrated circuit chip 23 in order to transmit the vibration signals to the application-specific integrated circuit chip 23.

FIG. 4 illustrates the circuit design of the application-specific integrated circuit chip 23. As shown in FIG. 4, the application-specific integrated circuit chip 23 includes a sampling module 231, a transform module 232 and an analysis module 233.

The sampling module 231 includes an analog front-end unit 2311, an analog-to-digital converter unit 2312 and a filter unit 2313. The analog front-end unit 2311 receives the vibration signals VS. The analog front-end unit 2311 may be, for example, an analog front-end circuit or a signal receiving circuit, etc. The analog-to-digital converter unit 2312 converts the vibration signals VS into a plurality of digital signals. The analog-to-digital converter unit 2312 may be, for instance, an analog-to-digital converter or a discrete signal converter, etc. The filter unit 2313 filters the digital signals to generate a plurality of time-domain data TD. The filter unit 2313 may be, for instance, a digital filter or a noise filter, etc.

The transform module 232 includes a transform unit 2321, a switching unit 2322, a memory unit 2323, a time interval unit 2324 and a transform coefficient unit 2325. When the filter unit 2313 generates the time-domain data TD, the switching unit 2322 switches to the filter unit 2313 to receive the time-domain data TD and transmits the time-domain data TD to the memory unit 2323. The switching unit 2322 may be, for example, a multiplexer or a switch, etc.

The memory unit 2323 stores the time-domain data TD in the first storage space thereof and transmits the time-domain data TD to the transform unit 2321. The memory unit 2323 has a special storage space management mechanism. More specifically, when the memory unit 2323 transmits the time-domain data TD to the transform unit 2321, the memory unit 2323 can simultaneously release the first storage space which has saved the time-domain data TD. In this way, the first storage space can be overwritten by another set of time-domain data TD. The memory unit 232 may be, for instance, a register or a RAM (random access memory), etc.

The time interval unit 2324 transmits a predetermined number N to the transform unit 2321 and the transform coefficient unit 2325 transmits a transform coefficient C to the transform unit 2321. The aforementioned predetermined number N is equal to the number of the time-domain data TD. In one embodiment, the predetermined number N is equal to the sample number of the sampling module 231. In another embodiment, the predetermined number N is not equal to the sample number of the sampling module 231. The transform unit 2321 can perform a time-frequency domain transform to transform the time-domain data TD to a frequency-domain data FD. The predetermined number N can be adjusted according to the actual condition. For example, if the predetermined number N is set to be 3, the transform unit 2321 can transform three time-domain data TD into one frequency-domain data FD. When the transform unit 2321 generates the frequency-domain data FD, the switching unit 2322 switches to the transform unit 2321 and receives the frequency-domain data FD. Then, the switching unit 2322 transmits the frequency-domain data FD to the memory unit 2323. The time interval unit 2324 may be, for example, a register or a RAM (random access memory), etc. The transform coefficient unit 2325 may be, for example, a register or a ROM (read-only memory), etc.

As described above, the transform module 232 has a special circuit structure and an operational mechanism. In details, the time interval unit 2324 can transmit the predetermined number N to the transform unit 2321. In one embodiment, the predetermined number N is equal to the number of the time-domain data TD and the sample number of the sampling module 231. In another embodiment, the predetermined number N is equal to the number of the time-domain data TD, but not equal to the sample number of the sampling module 231. Thus, it is not necessary to provide another additional sampling module between the filter unit 2313 and the switching unit 2322. In other words, the transform module 232 does not need to perform secondary sampling before the time-domain data TD are transformed into the frequency-domain data FD. Accordingly, the vibration sensor 2 can reduce the risk of data loss when the time-domain data TD are transformed into the frequency-domain data FD so as to achieve more accurate analysis result. In addition, as the transform module 232 has above special circuit structure and operational mechanism, so the detection bandwidth of the vibration sensor 2 can be directly adjusted by changing the output data rate (ODR) of the filter unit 2313 in order to satisfy the requirements of objects with different vibration bandwidths.

The memory unit 2323 stores the frequency-domain data FD in the second storage space thereof and transmits the frequency-domain data FD to the analysis module 233. Similarly, the memory unit 2323 performs the above storage space management mechanism. For example, when the memory unit 2323 transmits the frequency-domain data FD to the analysis module 233, the memory unit 2323 can simultaneously release the second storage space which has saved the frequency-domain data FD. In this way, the second storage space can be overwritten by another frequency-domain data FD. As described above, the vibration sensor 2 can execute the special storage space management mechanism, such that the memory unit 2323 of the vibration sensor 2 can selectively activate the writing protection mechanism or release some storage space in order to more effectively take advantage of the storage space. Accordingly, the application-specific integrated circuit chip 23 does not need an external memory element.

The analysis module 233 executes a comparison process to compare the frequency-domain data FD with a predetermined spectrum feature table. Then, the operation unit 2331 generates a notification signal S according to the comparison result of the comparison process. The analysis module 233 may be, for instance, a comparator or a logic operation unit, etc. when executing the comparison process, the analysis module 233 compares the frequency-domain points $A_1 \sim A_n$ of the frequency-domain data FD with the frequency-domain points $A_1' \sim A_n'$ of the predetermined spectrum feature table T, and then calculates the total difference value between the frequency-domain points $A_1 \sim A_n$ of the frequency-domain data FD and the frequency-domain points $A_1' \sim A_n'$ of the predetermined spectrum feature table T. When the comparison process confirms that the total difference value is greater than a threshold, the analysis module 233 sets the notification signal S to be a warning signal. When the notification signal S is set to be the warning signal, it means that the vibration status of the object has exceeded the acceptable range. In this case, the user can try to find out the reason why the vibration status of the object exceeds the acceptable range and then improve the vibration status of the object.

As vibration signals may be processed by complicated frequency spectrum transform and signal analysis, so currently available vibration sensors may transmit the vibration signals to an external monitoring machine. Then, the microcontroller of the monitoring machine may obtain the information of the vibration status of the object by executing frequency spectrum transform and signal analysis via signal analysis software. Therefore, currently available vibration sensors are inefficient and cannot conform to the actual requirements. However, according to one embodiment of the disclosure, the application-specific integrated circuit chip of the vibration sensor can analyze the frequency-domain data of the vibration signals, so the analysis time can be reduced. Thus, the efficiency of the real-time monitoring can be improved.

So as to conform to the requirements of different monitoring applications, an object may usually be installed with many vibration sensors, and may have a higher sampling frequency and a larger frequency-domain monitoring range. Accordingly, currently available vibration sensors may transmit a large amount of data, which tends to result in data loss and long transmission time. Therefore, the real-time monitoring for the object cannot be realized. However, according to one embodiment of the disclosure, the application-specific integrated circuit chip of the vibration sensor can directly analyze the frequency-domain data of the vibration signals instead of transmitting the vibration signals to an external monitoring machine for analysis, which can prevent the data from being lost and significantly decrease the data transmission time.

In addition, according to one embodiment of the disclosure, the application-specific integrated circuit chip of the vibration sensor has a special circuit structure and an operational mechanism, so the application-specific integrated circuit chip does not need another additional sampling module for secondary sampling. Therefore, the efficiency of the vibration sensor can be enhanced.

Moreover, according to one embodiment of the disclosure, the application-specific integrated circuit chip of the vibration sensor has a special circuit structure and an operational mechanism, so the detection bandwidth of the vibration sensor can be adjusted just by changing the output data rate (ODR) of the filter unit of the application-specific integrated circuit chip so as to meet the requirements of different objects with different vibration bandwidths. Thus, the application of the vibration sensor with monitoring function can be more comprehensive.

Furthermore, according to one embodiment of the disclosure, the application-specific integrated circuit chip of the vibration sensor integrates the vibration signal detection function with the vibration signal analysis function, and provides a special storage space management mechanism to more effectively use the storage space. Accordingly, the vibration sensor with monitoring function can be further miniaturized so as to satisfy the requirements of smart machinery industry, smart manufacturing industry and other relevant applications.

Figure 5:
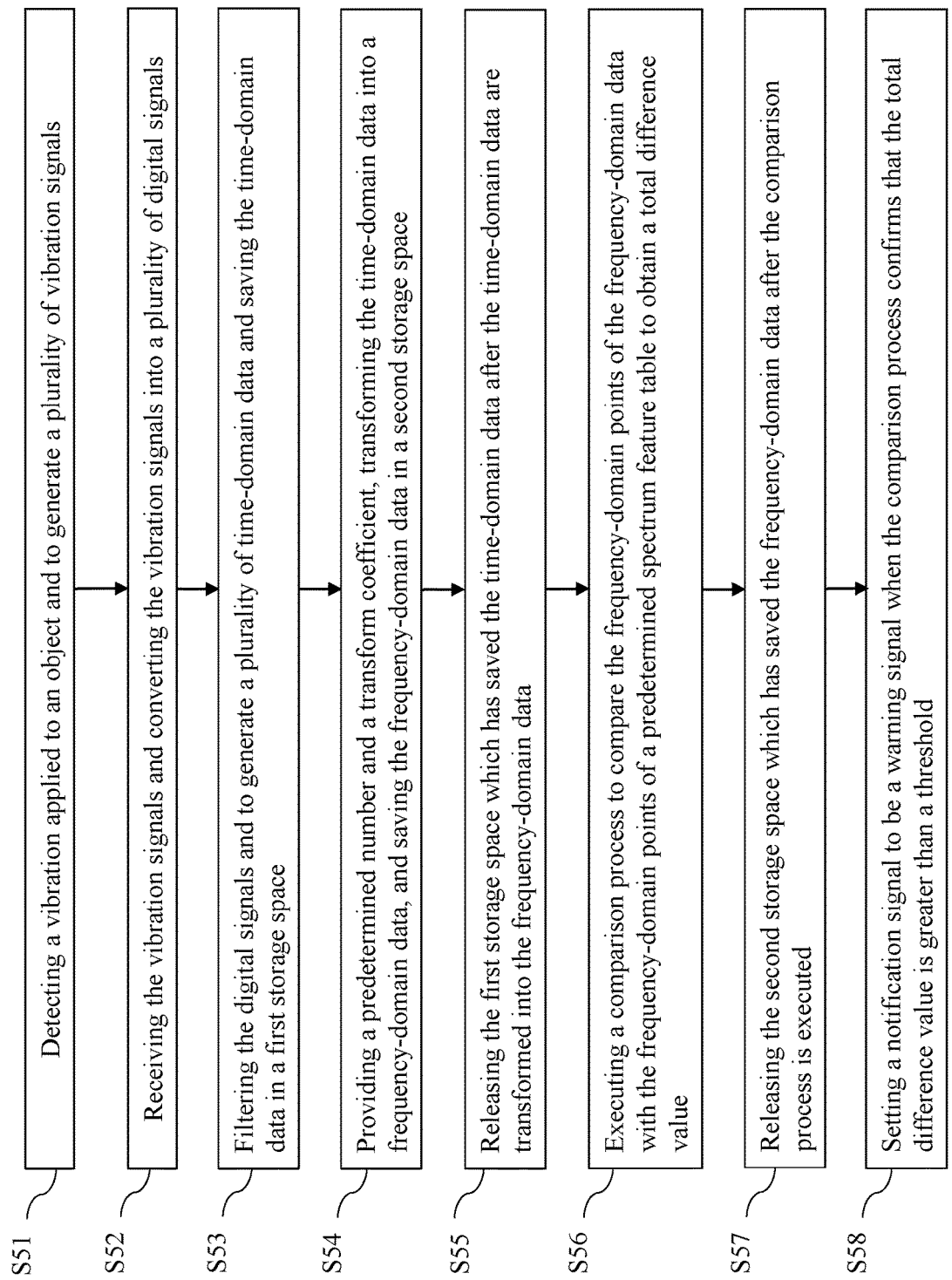
FIG. 5 is a process flow chart of the second embodiment.

Please refer to FIG. 5, which is a process flow chart of the vibration signal monitoring method of the second embodiment. As shown in FIG. 5, the vibration signal monitoring method of the vibration sensor 2 of the embodiment includes the following steps:

Step S51: detecting a vibration applied to an object and to generate a plurality of vibration signals.

Step S52: receiving the vibration signals and converting the vibration signals into a plurality of digital signals.

Step S53: filtering the digital signals and to generate a plurality of time-domain data and saving the time-domain data in a first storage space.

Step S54: providing a predetermined number and a transform coefficient, transforming the time-domain data into a frequency-domain data, and saving the frequency-domain data in a second storage space.

Step S55: releasing the first storage space which has saved the time-domain data after the time-domain data are transformed into the frequency-domain data.

Step S56: executing a comparison process to compare the frequency-domain points of the frequency-domain data with the frequency-domain points of a predetermined spectrum feature table to obtain a total difference value.

Step S57: releasing the second storage space which has saved the frequency-domain data after the comparison process is executed.

Step S58: setting a notification signal to be a warning signal when the comparison process confirms that the total difference value is greater than a threshold.

Figure 6B:
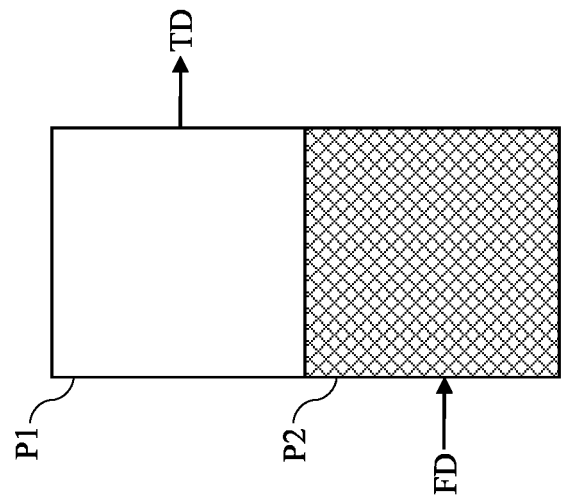
FIG. 6B is a second schematic view of the storage space management mechanism of the vibration sensor with monitoring function of the second embodiment.
Figure 6A:
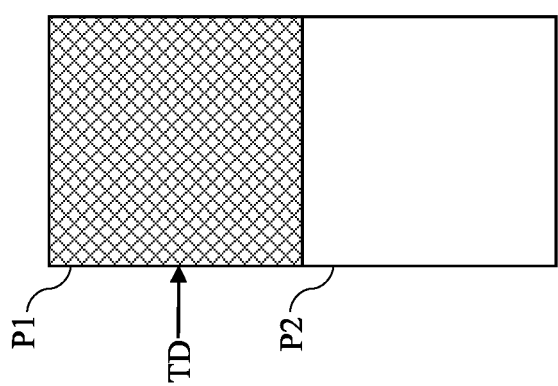
FIG. 6A is a first schematic view of a storage space management mechanism of the vibration sensor with monitoring function of the second embodiment.

Please refer to FIG. 6A~FIG. 6D, which are first~fourth schematic views of the storage space management mechanism of the vibration sensor with monitoring function of the second embodiment. As shown in FIG. 6A, the memory unit 2323 includes the first storage space P1 and the second storage space P2. The capacity of the first storage space P1 is determined by the predetermined number N and the sample number. Similarly, the capacity of the second storage space P2 is also determined by the predetermined number N and the sample number. The filter unit 2313 generates the time-domain data TD and transmits the time-domain data TD to the memory unit 2323 via the switching unit 2322. Afterwards, the memory unit 2323 stores the time-domain data TD in the first storage space P1.

As shown in FIG. 6B, the memory unit 2323 can release the first storage space P1 which has saved the time-domain data TD after transmitting the time-domain data TD to the transform unit 2321. Next, the transform unit 2321 generates the frequency-domain data FD and transmits the frequency-domain data FD to the memory unit 2323 via the switching unit 2322. The memory unit 2323 stores the frequency-domain data FD in the second storage space P2.

Figures 6C, 6D:
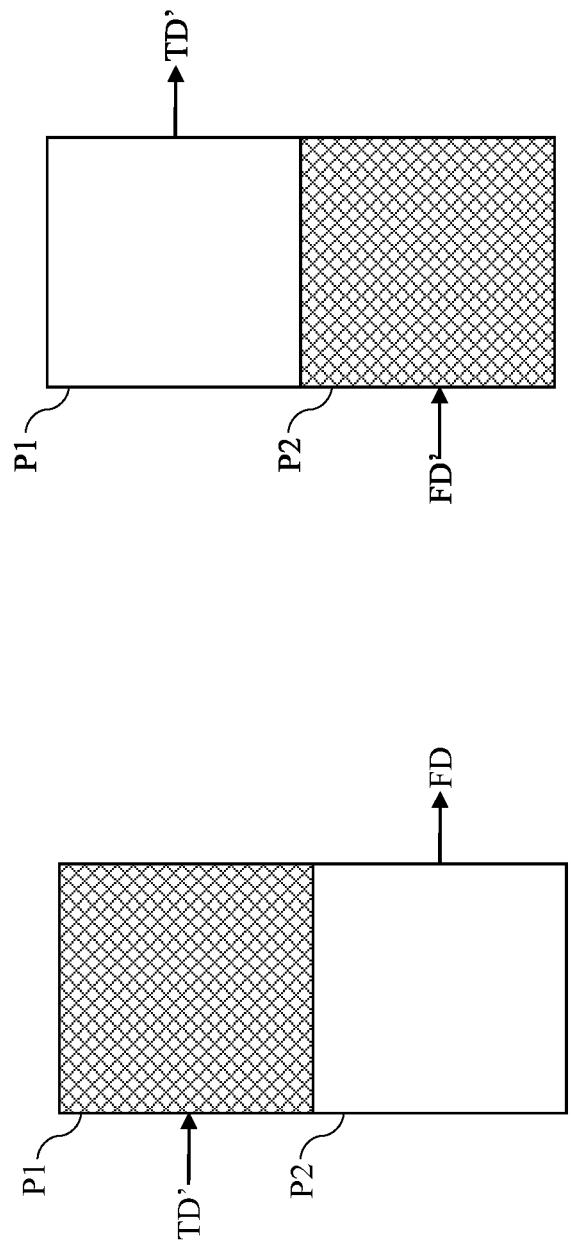
FIG. 6C is a third schematic view of the storage space management mechanism of the vibration sensor with monitoring function of the second embodiment.
FIG. 6D is a fourth schematic view of the storage space management mechanism of the vibration sensor with monitoring function of the second embodiment.

As shown in FIG. 6C, the memory unit 2323 can release the second storage space P2 which has saved the frequency-domain data FD after transmitting the frequency-domain data FD to the analysis module 233. As the memory unit 2323 has released the first storage space P1, so the next time-domain data TD' generated by the filter unit 2313 can be stored in the first storage space P1.

As shown in FIG. 6D, the memory unit 2323 can release the first storage space P1 which has saved the time-domain data TD after transmitting the time-domain data TD to the transform unit 2321. As the memory unit 2323 has released the second storage space P2, so the next frequency-domain data FD' generated by the transform unit 2321 can be stored in the second storage space P2.

As described above, the memory unit 2323 of the vibration sensor 2 is divided into the first storage space P1 and the second storage space P2. In addition, the capacity of the first storage space P1 and the capacity of the second storage space P2 are determined by the predetermined number N and the sample number. Therefore, the capacity requirement of the memory unit 2323 can be decreased and the memory unit 2323 still can store all necessary data. The above special storage space design can significantly reduce the capacity requirement of the vibration sensor 2.

Moreover, the vibration sensor 2 further has the special storage space management mechanism, so the storage space thereof can be more effectively utilized, which can further decrease the capacity requirement of the vibration sensor 2. Thus, the integration of the above storage space management and the storage space design can further miniaturize the vibration sensor, so it is unnecessary to provide an external memory element connected to the application-specific integrated circuit chip. Accordingly, the vibration sensor 2 can completely satisfy the requirements of smart machinery industry, smart manufacturing industry and other relevant applications.

In summation of the description above, the vibration sensor with monitoring function and the vibration signal monitoring method thereof in accordance with the embodiments of the disclosure have the following benefits:

(1) According to one embodiment of the disclosure, the application-specific integrated circuit chip of the vibration sensor can analyze the frequency-domain data of the vibration signals, so the analysis time can be reduced. Thus, the efficiency of the real-time monitoring can be improved.

(2) According to one embodiment of the disclosure, the application-specific integrated circuit chip of the vibration sensor can directly analyze the frequency-domain data of the vibration signals instead of transmitting the vibration signals to an external monitoring machine for analysis, which can prevent the data from being lost and decrease the data transmission time.

(3) According to one embodiment of the disclosure, the application-specific integrated circuit chip of the vibration sensor has a special circuit structure and an operational mechanism, so the application-specific integrated circuit chip does not need another additional sampling module for secondary sampling. Therefore, the efficiency of the vibration sensor can be enhanced.

(4) According to one embodiment of the disclosure, the application-specific integrated circuit chip of the vibration sensor has a special circuit structure and an operational mechanism, so the detection bandwidth of the vibration sensor can be adjusted just by changing the data updating rate of the filter unit of the application-specific integrated circuit chip so as to meet the requirements of different objects with different vibration bandwidths. Thus, the application of the vibration sensor with monitoring function can be more comprehensive.

(5) According to one embodiment of the disclosure, the application-specific integrated circuit chip of the vibration sensor integrates the vibration signal detection function with the vibration signal analysis function, and provides a special storage space management mechanism to more effectively use the storage space. Accordingly, the vibration sensor with monitoring function can be further miniaturized so as to satisfy the requirements of smart machinery industry, smart manufacturing industry and other relevant applications.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A vibration sensor with monitoring function, comprising:
   a substrate; and
   a microelectromechanical vibration sensor chip, disposed on the substrate and configured to detect a vibration applied to an object and to generate a plurality of vibration signals;
   an application-specific integrated circuit chip disposed on the substrate and electrically connected to the microelectromechanical vibration sensor chip, comprising:
      a sampling module, comprising:
         an analog front-end unit;
         an analog-to-digital converter unit; and
         a filter unit;
         wherein the analog front-end unit receives the plurality of vibration signals, the analog-to-digital converter unit converts the plurality of vibration signals into a plurality of digital signals, and the filtering unit filters the plurality of digital signals and to generate a plurality of time-domain data;
      a transform module, comprising:
         a transform unit; and
         a time interval unit;
         wherein the time interval unit transmits a predetermined number to the transform unit and the transform unit transforms the plurality of time-domain data into a frequency-domain data, and a number of the plurality of time-domain data is equal to the predetermined number; and
      an analysis module, configured to execute a comparison process to compare the frequency-domain data with a predetermined spectrum feature table and generate a notification signal according to a comparison result of the comparison process.

2. The vibration sensor of claim 1, wherein the predetermined number of the time interval unit is equal to a sample number of the sampling module.

3. The vibration sensor of claim 1, wherein the transform module further comprises a transform coefficient unit configured to transmit a transform coefficient to the transform unit, whereby the transform unit transforms the plurality of time-domain data into the frequency-domain data according to the predetermined number and the transform coefficient.

4. The vibration sensor of claim 1, further comprising at least one memory element electrically connected to the application-specific integrated circuit chip and configured to store the predetermined spectrum feature table.

5. The vibration sensor of claim 1, wherein the comparison process compares frequency-domain points of the frequency data with frequency-domain points of the predetermined spectrum feature table to obtain a total difference value, and the analysis module sets the notification signal to be a warning signal when the comparison process confirms that the total difference value is greater than a threshold.

6. The vibration sensor of claim 1, wherein the transform module comprises a memory unit; a first storage space of the memory unit stores the plurality of time-domain data and a second storage space of the memory unit stores the frequency-domain data.

7. The vibration sensor of claim 6, wherein a capacity of the first storage space and a capacity of the second storage space are determined by the predetermined number.

8. The vibration sensor of claim 6, wherein the memory unit releases the first storage space after the plurality of time-domain data are transmitted to the transform unit.

9. The vibration sensor of claim 8, wherein the memory unit deactivates a writing protection mechanism of the first storage space to release the first storage space, whereby the first storage space is overwritten by another set of time-domain data.

10. The vibration sensor of claim 8, wherein the memory unit deletes the plurality of time-domain data of the first storage space to release the first storage space, whereby the first storage space is overwritten by another set of time-domain data.

11. The vibration sensor of claim 6, wherein the memory unit releases the second storage space after the memory unit transmits the frequency-domain data to the analysis module.

12. The vibration sensor of claim 11, wherein the memory unit deactivates a writing protection mechanism of the second storage space to release the second storage space, whereby the second storage space is overwritten by another frequency-domain data.

13. The vibration sensor of claim 11, wherein the memory unit deletes the frequency-domain data of the second storage space to release the second storage space, whereby the second storage space is overwritten by another frequency-domain data.

14. The vibration sensor of claim 6, wherein the transform module further comprises a switching unit; the memory unit is electrically connected to the sampling module via the switching unit; the switching unit switches to the sampling module when the sampling module generates the plurality of time-domain data and switches to the transform unit when the transform unit generates the frequency-domain data.

15. A vibration signal monitoring method, comprising:
   detecting a vibration applied to an object and to generate a plurality of vibration signals;
   receiving the plurality of vibration signals and converting the plurality of vibration signals into a plurality of digital signals;
   filtering the plurality of digital signals and to generate a plurality of time-domain data;
   transforming the plurality of time-domain data into a frequency-domain data according to a predetermined number, wherein a number of the plurality of time-domain data is equal to the predetermined number; and
   executing a comparison process to compare the frequency-domain data with a predetermined spectrum feature table and generating a notification signal according to a comparison result of the comparison process.

16. The vibration signal monitoring method of claim 15, wherein a step of transforming the plurality of time-domain data into the frequency-domain data further comprises:
   providing a transform coefficient; and
   transforming the plurality of time-domain data into the frequency-domain data according to the predetermined number and the transform coefficient.

17. The vibration signal monitoring method of claim 15, wherein a step of transforming the plurality of time-domain data into the frequency-domain data further comprises:
   comparing frequency-domain points of the frequency-domain data with frequency-domain points of the predetermined spectrum feature table to obtain a total difference value; and
   setting the notification signal to be a warning signal when the comparison process confirms that the total difference value is greater than a threshold.

18. The vibration signal monitoring method of claim 15, further comprising:
   providing a first storage space for saving the plurality of time-domain data and providing a second storage space for saving the frequency-domain data, wherein a capacity of the first storage space and a capacity of the second storage space are determined by the predetermined number.

19. The vibration signal monitoring method of claim 18, wherein a step of providing the first storage space for saving the plurality of time-domain data and providing the second storage space for saving the frequency-domain data further comprises:
   releasing the first storage space after the plurality of time-domain data are transformed into the frequency-domain data.

20. The vibration signal monitoring method of claim 19, wherein a step of releasing the first storage space after the plurality of time-domain data are transformed into the frequency-domain data further comprises:
   deactivating a writing protection mechanism of the first storage space to release the first storage space, whereby the first storage space is overwritten by another set of time-domain data.

21. The vibration signal monitoring method of claim 19, wherein a step of releasing the first storage space after the plurality of time-domain data are transformed into the frequency-domain data further comprises:
   deleting the plurality of time-domain data of the first storage space to release the first storage space, whereby the first storage space is overwritten by another set of time-domain data.

22. The vibration signal monitoring method of claim 18, wherein a step of providing the first storage space for saving the plurality of time-domain data and providing the second storage space for saving the frequency-domain data further comprises:
   releasing the second storage space after the comparison process is executed.

23. The vibration signal monitoring method of claim 22, wherein a step of releasing the second storage space after the comparison process is executed further comprises:
   deactivating a writing protection mechanism of the second storage space to release the second storage space, whereby the second storage space is overwritten by another frequency-domain data.

24. The vibration signal monitoring method of claim 22, wherein a step of releasing the second storage space after the comparison process is executed further comprises:
   deleting the frequency-domain data of the second storage space to release the second storage space, whereby the second storage space is overwritten by another frequency-domain data.

* * * * *